United States Patent [19]

Bach

[11] 3,949,230

[45] Apr. 6, 1976

[54] ION BEAM SOURCE

[75] Inventor: Hans Bach, Armsheim, Germany

[73] Assignee: Jenear Glaswerk Schott & Gen., Mainz, Germany

[22] Filed: Mar. 19, 1975

[21] Appl. No.: 559,827

[30] Foreign Application Priority Data

Mar. 25, 1974 Germany............................ 7410342

[52] U.S. Cl. .................. 250/423; 250/426; 313/360

[51] Int. Cl.[2] .......................................... H01J 37/34

[58] Field of Search.................... 250/426, 423, 424; 313/360, 361, 362, 363

[56] References Cited

UNITED STATES PATENTS

| | | | |
|---|---|---|---|
| 2,724,056 | 11/1955 | Slepian | 250/426 |
| 2,733,346 | 1/1956 | Oppenheimer | 250/426 |

*Primary Examiner*—Craig E. Church

*Attorney, Agent, or Firm*—Littlepage, Quaintance, Murphy & Dobyns

[57] ABSTRACT

An ion beam source of the Penning type having an electrostatic tube lens, an ion-immersion lens and a conical screen.

22 Claims, 3 Drawing Figures

ION BEAM SOURCE

Figure 1:
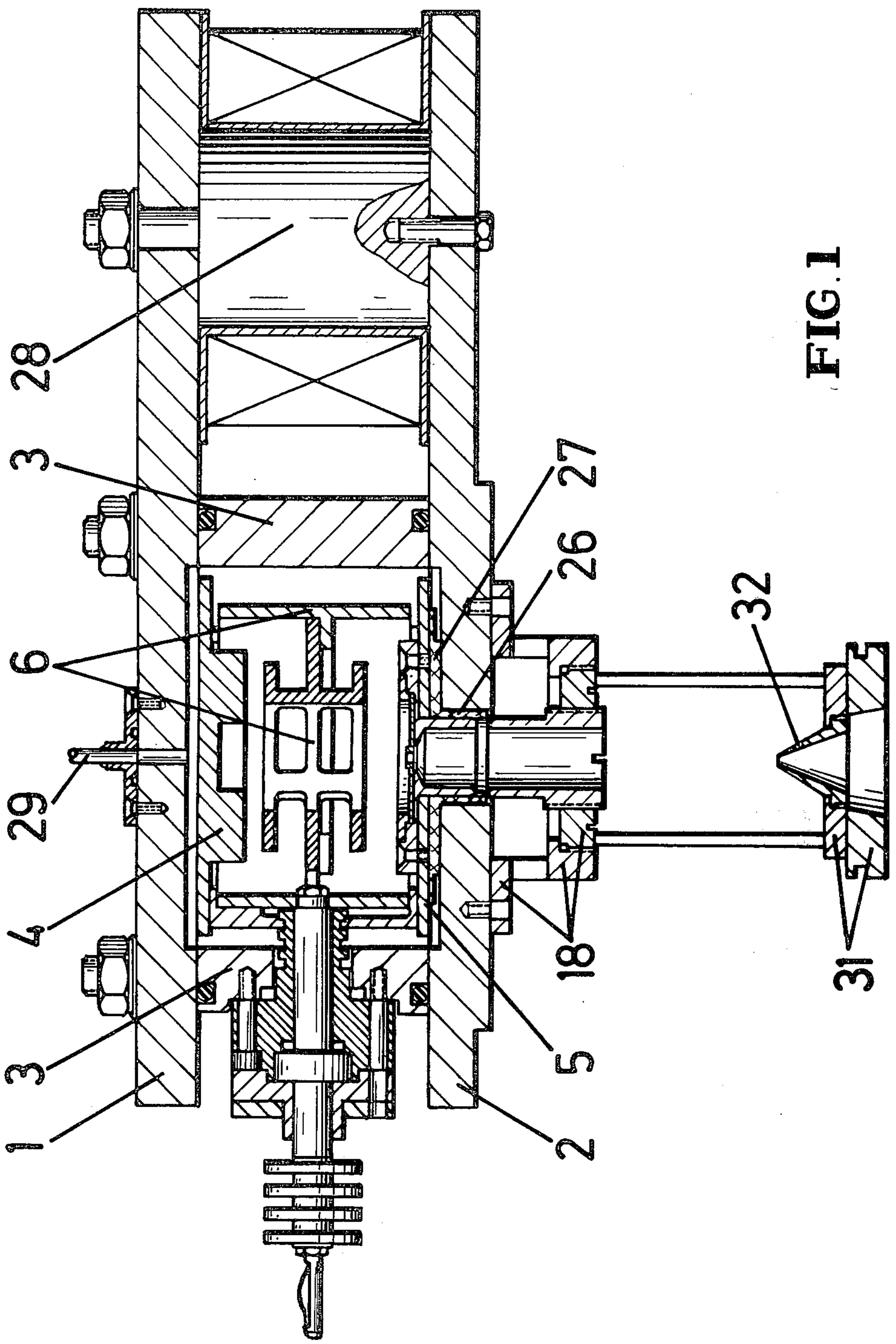

Ion beam sources of varying construction are known. These sources can be categorized according to the method of generating the ions:

Ion sources using cold cathode;

A. canal beam-ion sources,

B. high frequency-ions sources,

C. Penning ion sources, and ion sources using hot-cathodes;

D. arc discharged ion sources,

E. electron impact ion sources.

Such sources are well known for use in the field of mass spectroscopy and of analysis by ion beam induced radiation.

The following invention relates to ion beam generation done with a Penning ion source. Penning ion sources are known in which the positive or negative ions can be extracted and accelerated by electrostatic arrangement from a Penning-glow discharge. For many uses it is necessary to form the extracted ions to a beam that can be focussed by means of electrostatic lenses. This is particularly so to form an ion-parallel beam.

Those, heretofore known ion beam sources, particularly those beams generated from Penning-ion sources, have the following disadvantages:

1. variations in the thickness of the beam through the cross-section of the generated ionic beam, especially ion-parallel beams and therefore, 2. limitation of the usable beam diameter of the ion-parallel-beam to a few mm$^2$, 3. greater technical expense for the generation of ion-beams of sufficient ionic density, 4. greater technical expense for the generation of a constant beam, over longer time intervals, of constant and uniform ionic energy.

The object of the present invention is an ion source which does not have the above-named disadvantages. This goal is reached by using an ion beam-source of the Penning type, in which the ions can be taken from a Penning-glow-discharge by means of a simple extraction-system. For the extraction and simultaneous ion-beam-generation a combination of an electrostatic tube-lens, with an ion-immersion-lens which is formed from the plasma boundary to the field of the extraction potential, as well as a conical screen are provided, characterized in that they are comprised of the following structural components:

A. a housing whose top is made by an upper pole piece and whose bottom is made by a lower pole piece, between which is an outer cylinder cover, which describes an interior space and in this interior space the Penning-glow-discharge is supported, and outside of this cylinder cover is arranged an electromagnet, B. an anode-cathode system of a glow discharge arranged within the interior space of the housing, consisting of an upper cathode-side, a lower cathode-side, and of an anode-cage placed between both cathode sides, which consists of an inner cylinder-cover and of an insert. The insert is composed of three coaxial rings, which are fashioned from a continuous piece, and C. an electrostatic tubular lens, which is screwed into the lower side cathode, through a bore hole in the lower pole piece, and whose upper part consists of a tubing with flanges, whose middle part consists of an extraction screen, and whose lower part consists of a tube piece, which is screwed in a vertically adjustable permanent holder on the bottom pole piece.

For the extraction and simultaneous ion-beam-generation there is also used a combination of an electrostatic tube lens, an ion-immersion-lens as well as a conical screen.

the ion-immersion lens is formed of ions at the plasma-boundary at the free opening of the screen under the influence of the extraction potential. This extraction potential occurs between the inside of the Penning-discharge chamber and the chamber of the closed tube element of the tube lens on the one side and the other grounded part of the tube lens on the other side. (For extraction of positive ions the inside of the discharge chamber holds a positive charge.)

The conical screen confines the beam and screens out unwanted areas of greater ion density.

The effective functioning of the ion-beam-source according to the invention is dependent on the dimensions, the arrangement and the material chosen for the components. The pole pieces are of a material that can be magnetized. Such pieces are well known in the art. Magnet-pure-iron RFe 20 according to German Industrial Standard 17405 has been employed.

This described arrangement of electrode-conductor of the Penning-glow-discharge, obviates a special cooling unit (sometimes done through flowing water) of the total system, since the greatest part which in the glow discharge is in heat is transformed to electrical energy and is led over the anode cage of the glow discharge to the outside. The side-cathodes and the inner cylinder cover are proportioned in such a way that the glow-discharge does not penetrate out of the interior space which the cathodes and cylinder cover define and which supports the glow discharge. It is well known to one skilled in the art to design ion beam sources free of leakage.

The service life of this ion-beam-source is only limited by the vaporization depletion of the material used for the screen. The material for the screen consists of aluminum or of another metal that has a low value for the vaporization of the metal or carbon may be used.

The choice of material in the manufacture of the tube lens and the screen matters as much as the attachment ring of the screen for the static-free function of the construction for different uses. Preferably, the tube lens consists of stainless steel, the attachment ring of brass and the screen of aluminum. The tube piece 17 of the tube lens 12 is preferably made of stainless steel, designated German Industrial Standard 671, code Number 4104. The pole pieces 1 and 2 of the electromagnet are preferably made of Magnet-pure-iron designated RFe 20 according to German Industrial Standard 17405.

The electrical isolation and its adjustment as well as the dimensions of the components of the Penning-ion-source and the dimensions of the surrounding evacuated housing are so chosen, that the housing can be used up to an extraction potential of 10 KeV in the course of operation from ground potential. To achieve higher ion acceleration potentials the machine can be arranged, as is usually done, in an additionally grounded protective housing. This is done for the production of a stabilized ion-parallel-beam with an ionic-energy of at least 80 KeV. For the production of an ion-parallel-beam one must install correspondingly changed different tube lens diameters and correspondingly changed different intervals between the two tube lens parts from each other using the provided screw couplings. The three coaxial rings of the anode-cage describe an interior space for the plasma of the glow discharge. The value of the radii of the outer cross-section of the upper and lower rings to the radius of the interior space is about 1.6 to 1. The middle ring has the same diameter as the interior of the anode cage. The inner radius of the rings is so chosen that the quotient of the inner radius divided by the radius of the extraction screen is in the range of 9 to 14 for the production of an ion parallel beam and is in the range of 7 to 9 for the production of a beam that is to be focussed.

In the drawing is presented a diagram of an example of an ion-source according to the present invention. It shows:

FIG. 1 a cross-section through the ion-source

Figure 2:
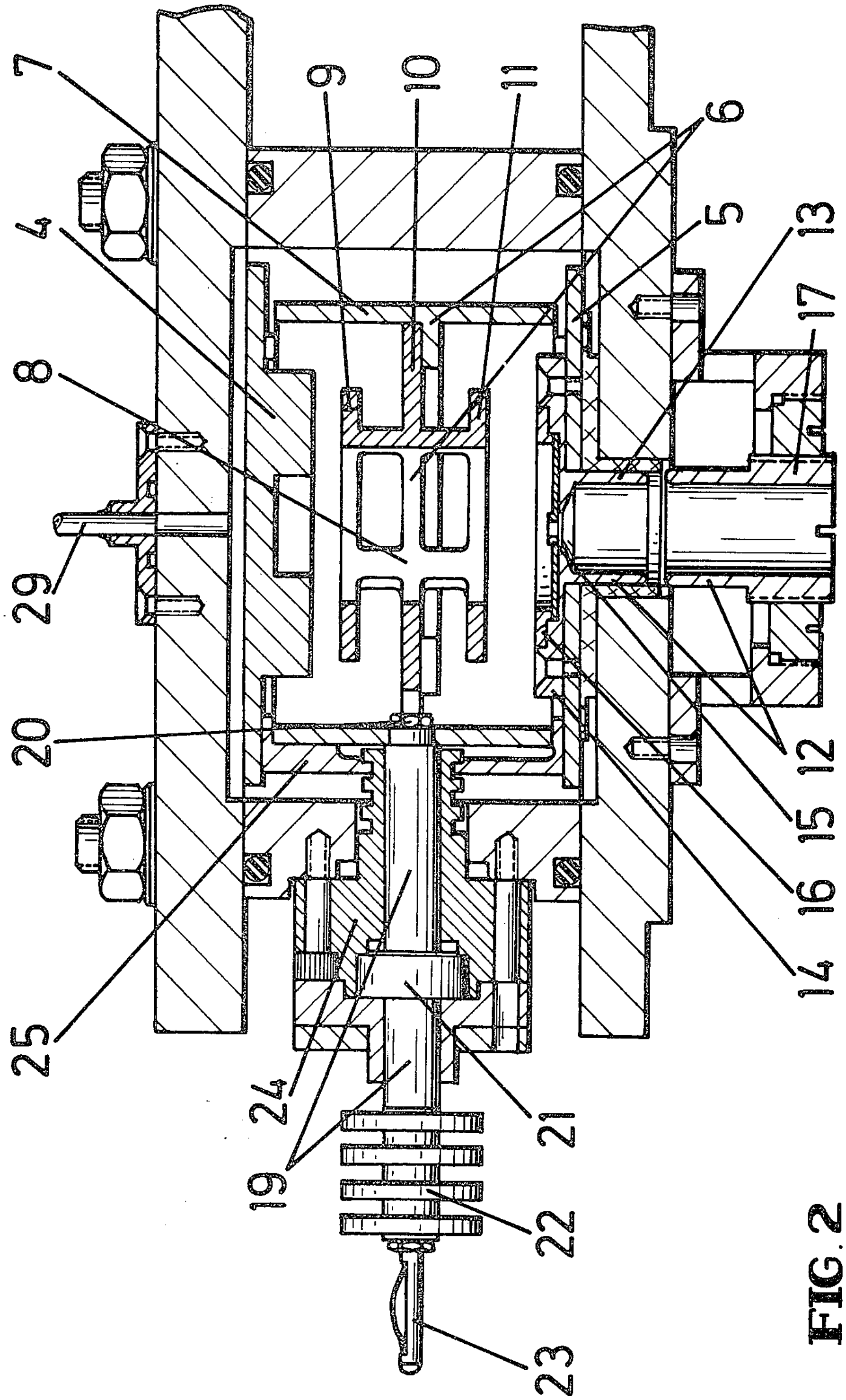

FIG. 2 an enlarged portion of FIG. 1 and

Figure 3:
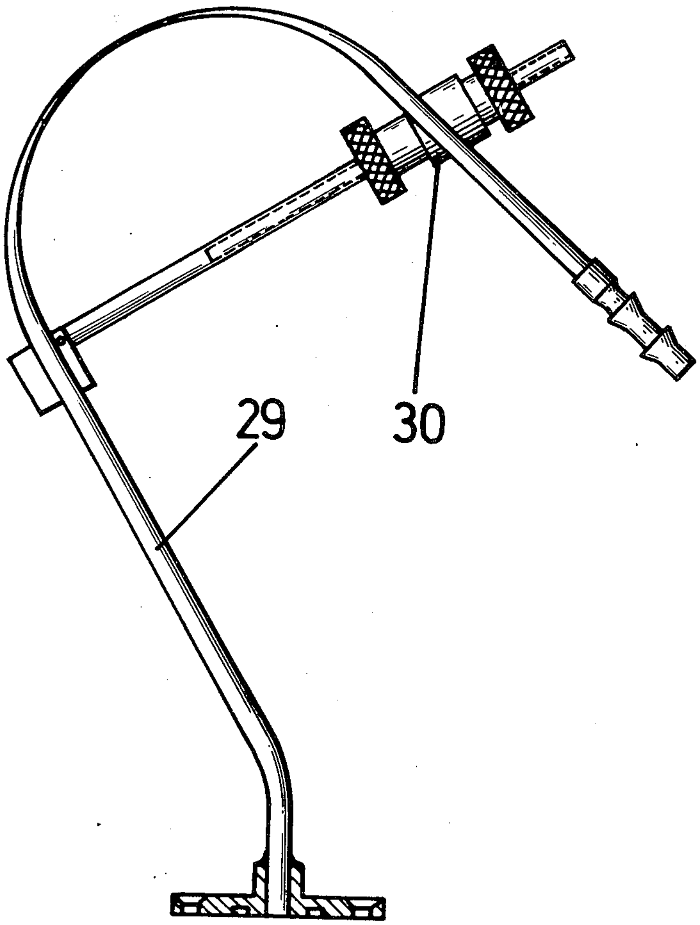

FIG. 3 a gas supply pipe shown with a regulator.

The ion source consists of:

1. an evacuable housing, which is enclosed by the pole pieces of an electromagnet of the Penning-glow dicharge and which in the interior 2. contains the two electrodes of the Penning-glow discharge (anode and cathode) as well as a 3. system for production of an electrostatic field, which extracts the ions from the Penning glow discharge, accelerates them, and is intended to change the degree of focusing of the ion-beam.

1. The Evacuable Housing

The evacuable housing is made from both pole pieces of the electromagnet and of an outer cylinder cover 3. The pole pieces 1 and 2 are pressed by means of brass screws to the base sides of the cylinder cover 3 and with screws bound fast to the core of the electromagnet 28. By this sealing of the base sides of the outer cylinder cover can the housing be made vacuum tight and at the same time is mechanically held together.

2. Electrodes of the Penning-glow-discharge

The electrodes of the Penning-glow discharge, consisting of upper and lowers side electrodes 4 and 5 and the anode-cage 6 are screwed with a bolt 19, which is attached through block 24 of teflon against the outside of the cylinder cover 3, which serves to isolate them and which hold the electrodes 4 and 5 as well as 6 in their desired position within the outer cylinder cover 3. The bolt 19 serves as much for attaching the electrodes as for introducing the power supply. (Teflon is a trademark for polytetrafluoroethylene and a similar electrically insulating substance can be substituted.) The upper side cathode may be equipped with an attachment piece that has a ring shape for connection with the anode cage. The lower side cathode may be constructed as a flat ring into which the upper part of the tube lens can be attached by means of a flange and screws.

The bolt 19 also contains a shoulder 21, which is so pressed against the isolated block, that the existing seal between block 24 and shoulder 21 of the bolt 19 guarantees a good vacuum in the inner room. Furthermore, the bolt 19 is so fastened in its place through pressure that the anode cage 6 and the sides of the cathodes 4, 5 can not change their position during the running of the equipment and the electrodes are particularly so contained that the axis of the anode cage and that of the side-cathodes 4 and 5 remain in the axis of the extraction-system. On the bolt is also arranged cooling fins 22 which serve to move the heat, and a plug 23, over which the combustion chamber flows, i.e. the extraction potential is directed. The bolt 19 and its screws with both electrodes of the Penning-glow discharge 4, 5 and 6 are such in dimension that even under full load operating capacity the heat exhaust of the electrodes does not reach outside. More than one bolt may be used. It is possible to employ a bolt similar to bolt 19 also fitted with a shoulder, cooling fin and plug and arranged at about angle of about 45° to the bolt 19 shown. Such a bolt which may be used specifically for the power supply and bolt 19 as shown are imbedded in a composition block of polytetrafluoroethylene which serves to isolate them from the grounded cylinder cover.

The anode cage 6 consists of an inner cylinder cover 7 and an insert 8. The insert 8 is screwed on a shoulder in the inner part of the cylinder cover 7 and guarantees therefore a strengthened good heat conductance from the insert 8 to the outside. This insert 8 is also made from a piece of brass, which has three coaxial rings 9, 10, and 11, parallel to the cathode sides. It is screwed with a screw to one of the bolts 19 which serve for the power supply and heat conductance and is isolated with a block of Teflon against the outer cylinder cover 3 and held in the aforementioned position. The three coaxial rings have the same inner radii. However, the outer radii are different. Ring 9 and 11 have outer radii which are the same and this radius is so chosen that the ratio of it to the radius of the interior space is about 1.6 to 1. The middle ring 10 has the same diameter as the diameter of the interior of the anode cage. The diameter of the interior of the anode cage is shown as the distance *d* in the space of the insert 8. The radius is *d*/2. Furthermore, the middle ring is screwed to the anode cage and separate the space between the exterior of the ring and the interior of the anode cage. The inner radius of the rings is so chosen that the quotient of the inner radius of the rings divided by the radius of the extraction screen is in the range of 9 to 14 for the production of an ion parallel beam and is in the range of 7 to 9 for the production of a beam that is to be focussed.

The two negative sides of the cathode 4 and 5 of the Penning-glow-discharge consist preferably of aluminum and are joined mutually by a cross-piece 25 and by two more brass bolts (not shown) joined mutually to the electrical lead and held parallel to each other. The cross-piece 25 is also screwed with one of the bolts serving as power supply such as 19 and thereby so fixed in its place in the interior of the outer cylinder cover that both sides of the cathode 4 and 5 the anode cage 6 can not move and that during operation a short circuit can not occur. A sleeve 26 with flange 27 isolates the lower side of the cathode with Teflon against the housing and seals off the housing between the side-cathode 5 and lower pole piece 3 against the high vacuum-container into which the ion beam is directed. Simultaneously, through this sleeve those side electrodes 4 and 5 fastened together by the cross piece 25 are adjusted centrally to the axis of the outer cylinder cover 3 and to the axis of the tube lens 12 of the extraction system.

The Penning-glow discharge takes place between the side electrode 4 and 5 on one side and preferably in the vicinity of the interior of the inner cylinder cover 7 along parts of the insert 8 of the anode cage 6.

3. The Extraction, Acceleration and Focusing-System

For the extraction of ions a tube lens serves, which consists of two tubular pieces, whereby on the upper tube piece 13 positive extraction potential is applied for the extraction of, for example, positive ions, and the lower tube piece 17 is grounded. The upper tube piece is connected with the lower cathode side (negative pole of the Penning-glow discharge) over the flange 14 mechanically and directly with screws. The opening, through which ions are extracted, is formed from an extraction-screen 15 which with an insert 16 (brass ring) in a recessed groove of the flange 14 is bound tightly and directly with brass screws. For the ignition of the glow discharge and during the service life this guarantees a definite direct bond between flange 14 and extraction-screen 15.

The lower tube piece 17 of the tube lens consists of an attachment with a threaded screw, through which the tube piece by means of a holder 18 is held in the same axis with the lens piece 13. In this way the space between lens pieces can be changed for the standardization of desired potential-courses between both lens pieces, both for extraction and for collating of the ion beam or for formation of an ion-parallel-beam.

Unavoidable inhomogeneities in the ion density of the generated beam on the outside boundary of the beam can be screened out with a screen which is attached to the holder 18 by 3 bolts which is designed as a conical cover 32 whose narrow end with the opening points to the tube lens 12. The ring-disc 31, which carries this conical cover, can be moved, if needed, through a corresponding apparatus, different from FIG. 1, in a plane perpendicular to the beam axis, in order to utilize during operation, those ions in the axial--vicinity of the beam lying in the area of the extracted ion beam.

The gas-inlet for the Penning-glow discharge is placed symmetrically to the outer cylinder cover 3 through a brass tube 29 FIG. 3. This brass tube is bent in its upper part so that the diameter is squeezed together and is semi-circular, and is provided with a pinch screw 30 which changes the radius of the semi-circle and thereby also the net-cross-section, so that this squeezed off part of the brass tube can serve as a fine-regulator of the gas supply.

One of the major advantages of the present invention is the fact that a uniform ion beam of increased diameter is obtained which diameter can be easily adjusted to different ions and different purposes. As far as is known, such advantages could not be achieved heretofore with ion beam sources using cold cathodes.

The ion beam source according to the invention is particularly useful as a means for thinning materials for IR-transmission investigations.

What is claimed:

1. An ion-beam-source of the Penning type in which the ions of a Penning-glow-discharge are obtained by means of a simple extraction system whereby for the extraction and simultaneous ion-beam-generation a combination of (a) an electrostatic tube lens, and (b) an ion-immersion-lens formed of ions from the plasma-boundary to the field of extraction-potential, and (c) a conical screen is provided, characterized in that the combination is comprised of the following components:

A. a housing whose top is an upper pole piece (1) and whose bottom is a lower pole piece (2), and between these pole pieces is provided an outer cylinder cover (3) which describes an interior space and in which interior space of the housing is supported the Penning-glow-discharge, and outside of this cylinder cover an electromagnet is arranged, B. an anode-cathode system of a glow discharge is provided within the interior space of the housing and consists of an upper side-cathode (4), a lower side-cathode (5) and an anode-cage (6), placed between both cathodes, said anode cage consisting of an inner cylinder cover (7) and an insert (8) and said insert is made of three coaxial rings (9), (10), and (11) which are made from a continuous piece and C. an electrostatic tube lens (12) which is screwed directly into the lower side-cathode (5) by means of a groove in the lower pole piece (2) and this electrostatic tube lens consists in its upper section of a tube piece (13) with flange (14), in its middle section of an extraction screen (15) and in its lower section of a tube piece (17), said tube piece (17) is in a permanent holder (18), and said holder is vertically adjustable and is screwed to the lower pole piece (2).

2. An ion-beam-source according to claim 1, characterized in that the mechanical holder of the anode-cage (6) in the outer cover (3), the power supply lead to the anode-cage (6) and the heat-conductance from the anode cage through the outer cylinder cover (3) are accomplished by means of an existing bolt, said bolt being preferably of brass and is screwed tight by means of a screw (20) penetrating through the inner cylinder cover to the anode cage and the bolt is provided with a shoulder (21), cooling fins (22) and a plug (23).

3. Ion-beam-source according to claim 1, characterized in that the power supply and the heat conductance are conducted to the side-cathodes (4) and (5) through the outer cylinder cover (3) by means of another bolt similar to bolt (19) said other bolt is fitted with a shoulder, cooling fins, and a plug and which is arranged at an angle of about 45° to the bolt (19).

4. Ion-beam-source according to claim 2, characterized in that any bolt used for the power supply to the side-cathode and heat conductance is imbedded in a composition block of polytetrafluoroethylene which serves to isolate it from the grounded cylinder cover.

5. An ion-beam-source according to claim 2, characterized in that the bolt which serves as lead for the electrical power to the side-cathodes (4) and (5) is connected with these side-cathodes by means of a cross-piece (25) in the interior of the housing.

6. An ion-beam-source according to claim 1, characterized in that the gas-inlet to the glow discharge interior space utilizes an existing tube (29), said tube made preferably of brass, and the gas-inlet is provided with a pinch-screw (30) which serves as a regulator and said gas inlet is aligned symmetricaly to the anode-cage and side-cathodes in the axis of the outer cylinder cover.

7. An ion-beam-source according to claim 1 characterized in that the lower side cathode (5) consists of a flat ring which is screwed with the flange (14) and attached to the upper part of the tube piece (13).

8. An ion-beam-source according to claim 1, characterized in that the upper side cathode (4) has a ring form attachment to the anode-cage (6).

9. An ion-beam-source according to claim 1, characterized in that the side-cathodes (4) and (5) and the inner cylinder cover (7) are proportioned in such a way that the glow-discharge does not penetrate out of the interior space which the cathodes and cylinder cover define and which supports the glow-discharge.

10. An ion-beam-source according to claim 1, characterized in that the extraction screen (15) consists of aluminum or of another metal with a low metal vaporization or of carbon.

11. An ion-beam-source according to claim 1, characterized in that on the holder (18) on three bolts arranged to be in the plane perpendicular to the axis of the beam hangs a moveable ring-disc in which a conical cover (32) is placed, with the narrow-end of the conical cover pointing upwards.

12. An ion-beam-source, according to claim 1, characterized in that the side cathodes (4) and (5) consist of aluminum and the insert (8) consists of brass.

13. An ion-beam-source according to claim 1, characterized in that the tube-piece (13) is isolated from the lower pole piece by a sleeve (26) with a flange (27), said sleeve and flange consisting preferably of polytetrafluoroethylene.

14. An ion-beam-source according to claim 1, characterized in that the part of the tube-lens (12), namely the tube piece (17) consists of stainless steel, German industrial Standard 671, Code number 4104.

15. An ion-beam-source according to claim 1, characterized in that the pole pieces (1) and (2) are made of Magnet-pure-iron RFe 20 according to German Industrial Standard 17405.

16. An ion-beam-source according to claim 1, characterized in that the flange (27) and sleeve (26) close off the inner housing against the high vacuum interior into which the ion-beam is directed.

17. An ion-beam-source according to claim 1, characterized in that the three coaxial rings (9), (10), and (11) of the anode-cage in the interior of the anode-cage describe such an interior space for the plasma of the glow-discharge, whereby the value of the radii of the outer cross-section of the upper and lower rings (9) and (11) to the radius of the interior space is about 1.6:1.

18. An ion-beam-source according to claim 1, characterized in that for a chosen value for the inner radius of the rings (9), (10) and (11) the quotient of the inner radius divided by the radius of the extraction screen (15) is in the range of 9 to 14 for the production of an ion-parallel beam.

19. An ion-beam-source according to claim 1, characterized in that for a chosen value for the inner radius of the rings (9), (10) and (11) the quotient of the inner radius divided by the radius of the extraction screen (15) is in the range of 7 to 9 for the production of a beam that can be focussed.

20. An ion-beam-source according to claim 1, characterized in that the middle ring (10) of the anode-cage (6) has the same diameter as the interior of the anode cage and said middle ring is screwed to the anode cage and separates the space between the exterior of the ring and the interior of the anode cage (6).

21. An ion-beam-source of the Penning type in which the ions of the Penning-glow-discharge are obtained by means of a simple extraction system whereby for the extraction and simultaneous ion-beam-generation a combination of (a) an electrostatic tube lens, and (b) an ion-immersion-lens formed of ions from the plasma-boundary to the field of extraction potential, and (c) a conical screen is provided, characterized in that the combination is comprised of the following components:

A. a housing whose top is an upper pole piece and whose bottom is a lower pole piece (2), the pole being made of iron suitable for use as a magnet, and between these pole pieces is provided an outer brass cylinder cover (3) which circumscribes an interior space in which interior space of the housing is supported the Penning-glow-discharge, and outside of this cylinder cover an electromagnet is arranged, and B. an anode-cathode system of a glow discharge is provided within the interior space of the housing and consists of an upper side cathode (4) with a ring for attaching the anode cage and a lower side cathode (5) with a ring for attaching the tube piece, said cathodes being made of aluminum, and connected by a cross piece (25) to the source supply bolt (19), and an anode cage (6) placed between both cathodes, said anode cage consisting of a brass inner cylinder cover (7) and an insert (8) made of brass and said insert is made of three coaxial rings (9), (10) and (11) which are made from a continuous piece wherein the rings (9) and (11) have the same outer radius and the value of said radius to the radius of the interior of the anode cage designated $d/2$, is 1.6:1, and the middle ring (10) has the same diameter as the interior diameter $d$ and this middle ring separates the space between the exterior of the ring and the interior of the anode cage, and the quotient of the inner radius of.the rings which is the same for all divided by the radius of the extraction screen (15) is in the range of 9 to 14 for the production of an ion-parallel beam, and C. an electrostatic tube lens (12) made of brass which is screwed directly into the lower side cathode (5) by means of a groove in the lower pole piece and this electrostatic tube consists in its upper section of tube piece (13) with a flange, in its middle section of an extraction screen (15) of aluminum and in its lower section of a tube piece (17) of stainless steel said tube piece (17) is in a permanent holder 18 and said holder is vertically adjustable and is screwed to the lower pole piece and said tube piece (13) is isolated from the lower pole piece by a sleeve (26) and flange (27) made of polytetrafluoroethylene, and wherein the power supply to the electrodes and the heat conductance is accomplished through one or more brass bolts, said bolts having a shoulder, cooling fins and plug and such bolt is isolated from the grounded cylinder cover by polytetrafluorolthylene, and further characterized in that the side cathodes (4) and (5) and inner cylinder cover (7) are proportioned in such a way that the glow discharge does not penetrate out of the interior space which the cathodes and cylinder cover define and which supports the glow discharge, and the gas inlet utilizes an existing from tube (29), aligned symmetrically to the anode cage and side cathodes in the axis of the outer cylinder and the gas supply is regulated with a pinch screw on the gas inlet line.

22. An ion beam source of the Penning type in which the ions of a Penning-glow-discharge are obtained by means of a simple extraction system whereby for the extraction and simultaneous ion-beam-generation a combination of (a) an electrostatic tube lens, and (b) an ion-immersion-lens formed of ions from the plasma-boundary to the field of extraction potential, and (c) a conical screen is provided, characterized in that the combination is comprised of the following components:

A. a housing whose top is an upper pole piece and whose bottom is a lower pole piece (2) the poles being made of iron suitable for use as a magnet, and between these pole pieces is provided an outer brass cylinder cover (3) which circumscribes an interior space and in which interior space of the housing is supported the Penning-glow-discharge, and outside of this cylinder cover an electromagnet is arranged, and B. an anode-cathode system of a glow discharge is provided within the interior space of the housing and consists of an upper side cathode (4) with a ring for attaching the anode cage and a lower side cathode (5) with a ring for attaching the tube piece, said cathodes being made of aluminum, and connected by a crosspiece (25) to the power supply bolt (19) and an anode cage (6) placed between both cathodes, said anode cage consisting of a brass inner cylinder cover (7) and an insert (8) made of brass and said insert is made of three coaxial rings (9), (10) and (11) which are made from a continuous piece wherein the rings (9) and (11) have the same outer radius and the value of said radius to the radius of the interior of the anode cage, designated $d/2$ is 1.6 to 1, and the middle ring (10) has the same diameter as the interior diameter, $d$, and this middle ring separates the space between the exterior of the ring and the interior of the anode cage, and the quotient of the inner radius of the rings, which is the same of all rings, divided by the radius of the extraction screen (15) is in the range 7 to 9 for the production of a beam that can be focussed, and C. an electrostatic tube lens (12) made of brass which is screwed directly into the lower side cathode by means of a groove in the lower pole piece and this electrostatic tube consists in its upper section of a tube piece (13) with a flange, in its middle section of an extraction screen (15) of aluminum and in its lower section of a tube piece (17) of stainless steel, said tube piece (17) is in a permanent holder (18) and said holder is vertically adjustable and is screwed to the lower pole piece and said tube piece (13) is isolated from the lower pole piece by a sleeve (26) and flange (27) made of polytetrafluoroethylene, and wherein the power supply to the electrodes and the heat conductance is accomplished through one of more brass bolts, said bolts having a shoulder, cooling fins, and plug and such bolt is isolated from the grounded cylinder cover by polytetrafluoroethylene, and wherein the ion-beam source is further characterized in that the side cathodes (4) and (5) an inner cylinder cover (7) are proportioned in such a way that the glow discharge does not penetrate out of the interior space which the cathodes and cylinder cover define and in which interior space the glow discharge is supported and still further, that the gas inlet utilizes an existing brass tube (29), aligned symmetrically to the anode cage and side cathodes in the axis of the outer cylinder and the gas supply is regulated with a pinch screw on the gas inlet line.

* * * * *